(12) United States Patent
Seo et al.

(10) Patent No.: US 7,354,827 B2
(45) Date of Patent: Apr. 8, 2008

(54) TRANSISTOR HAVING ASYMMETRIC CHANNEL REGION, SEMICONDUCTOR DEVICE INCLUDING THE SAME, AND METHOD OF FABRICATING SEMICONDUCTOR DEVICE INCLUDING THE SAME

(75) Inventors: Hyeoung-Won Seo, Gyeonggi-do (KR); Du-Heon Song, Gyeonggi-do (KR); Sun-Joon Kim, Gyeonggi-do (KR); Jin-Woo Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 319 days.

(21) Appl. No.: 11/100,685

(22) Filed: Apr. 6, 2005

(65) Prior Publication Data

US 2005/0218434 A1    Oct. 6, 2005

(30) Foreign Application Priority Data

Apr. 6, 2004    (KR) ..................... 10-2004-0023547

(51) Int. Cl.
*H01L 21/336* (2006.01)
(52) U.S. Cl. ..................... 438/270; 438/271; 438/587; 438/588; 257/331; 257/E29.134
(58) Field of Classification Search ................ 438/270, 438/271, 587, 588
See application file for complete search history.

(56) References Cited

U.S. PATENT DOCUMENTS 6,395,604 B1 * 5/2002 Kubo et al. ................. 438/270
6,436,765 B1 * 8/2002 Liou et al. ................... 438/259
6,596,594 B1    7/2003 Guo
6,849,899 B2 * 2/2005 Hshieh et al. ............... 257/332

FOREIGN PATENT DOCUMENTS

| JP | 02-023668 | 1/1990 |
| JP | 02-249276 | 10/1990 |
| JP | 08-097419 | 4/1996 |
| JP | 11-284187 | 10/1999 |
| KR | 1998-058692 | 10/1998 |

OTHER PUBLICATIONS

English abstract of Korean Publication No. 1998-058692.
English abstract of Japanese Publication No. 08-097419.
English abstract of Japanese Publication No. 11-284187.

* cited by examiner

*Primary Examiner*—Wai-Sing Louie
(74) *Attorney, Agent, or Firm*—Marger Johnson & McCollom, P.C.

(57) ABSTRACT

According to embodiments of the invention, a transistor includes a semiconductor substrate having an active region. A channel trench is disposed to cross the active region. A gate insulating layer covers an inner wall of the channel trench. A gate pattern is disposed to fill the channel trench and to extend over a main surface of the semiconductor substrate. Source/drain regions having a first conductivity are disposed in the active region at both sides of the channel trench. A channel impurity region having a second conductivity is disposed beneath one of the source/drain regions to be in contact with at least a sidewall of the channel trench.

7 Claims, 13 Drawing Sheets

US 7,354,827 B2

TRANSISTOR HAVING ASYMMETRIC CHANNEL REGION, SEMICONDUCTOR DEVICE INCLUDING THE SAME, AND METHOD OF FABRICATING SEMICONDUCTOR DEVICE INCLUDING THE SAME

CROSS-REFERENCE TO RELATED APPLICATIONS

This application claims the benefit of Korean Patent Application No. 2004-23547, filed 6 Apr. 2004, the content of which is hereby incorporated by reference in its entirety.

BACKGROUND OF THE INVENTION

1. Field of the Invention

This disclosure relates to a transistor, a semiconductor device, and a method of fabricating the semiconductor device and, more particularly, to a transistor having an asymmetric channel region, a semiconductor device including the transistor, and a method of fabricating the semiconductor device.

2. Description of the Related Art

In semiconductor devices, discrete devices, such as MOS transistors, have been widely employed as switching devices. As integration of semiconductor devices increases, the MOS transistors are being gradually scaled down. As a result, channel lengths of the MOS transistors are reduced, which may cause a short channel effect.

Implanting channel ions into a channel region at a high concentration is generally used to prevent a threshold voltage from being reduced due to the short channel effect. However, implanting channel ions at a high concentration increases the channel resistance, resulting in degraded current driving capability. Furthermore, the concentration increase of the channel ions is accompanied by an increase of an electric field between the channel region and source/drain regions. Accordingly, the leakage current increases between the channel region and the source/drain regions. In particular, where a capacitor that stores charges is connected to the source region or the drain region as in a DRAM device, the increase of the leakage current deteriorates refresh characteristics of the device.

There is, therefore, a need to prevent the short channel effect due to reduction in the channel length of the MOS transistor and preventing the refresh characteristics from being deteriorated due to the increase of the leakage current. In particular, there is a need to maintain a constant threshold voltage while reducing an electric field between the channel region and the source/drain regions to which the capacitor is connected.

A method of fabricating an asymmetric source/drain transistor is taught in U.S. Pat. No. 6,596,594 to Guo, et al., entitled "Method of Fabricating Field Effect Transistor (FET) Device with Asymmetric Channel Region and Asymmetric Source and Drain Regions."

Embodiments of the invention address the above and other disadvantages of the conventional art.

SUMMARY OF THE INVENTION

Embodiments of the invention include a transistor, a semiconductor device, and a method capable of simultaneously preventing a short channel effect as well as deterioration of a refresh characteristic due to leakage current in a junction region. Other embodiments include methods of manufacturing the transistor and semiconductor device.

BRIEF DESCRIPTION OF THE DRAWINGS

The foregoing and other objects, features, and advantages of the invention will be apparent from the more particular description of several preferred embodiments of the invention, as illustrated in the accompanying drawings. The drawings are not necessarily to scale, as emphasis is instead being placed upon illustrating the principles of the invention.

DETAILED DESCRIPTION OF THE INVENTION

Figure 1:
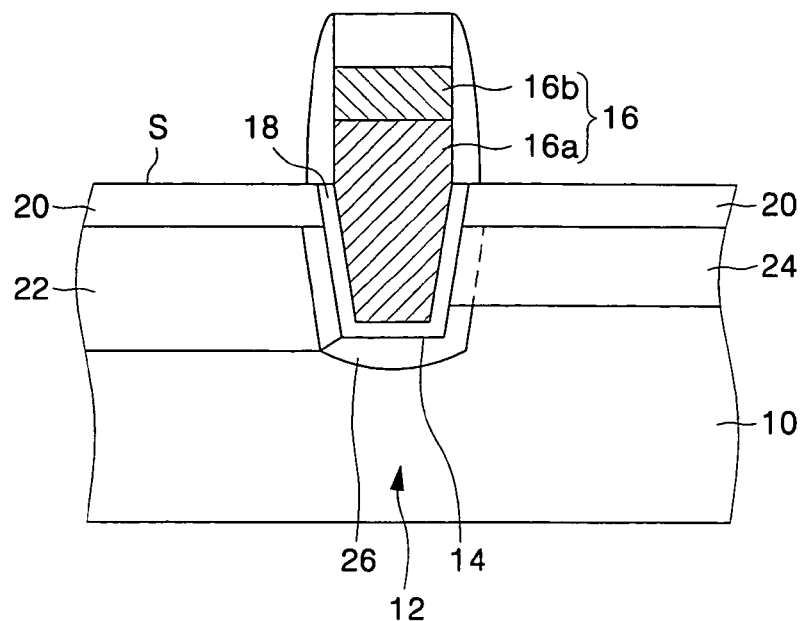
FIG. 1 is a sectional diagram that illustrates a MOS transistor with an asymmetric channel region according to some embodiments of the invention.

Hereinafter, preferred embodiments of the invention will be described in detail with reference to the accompanying drawings. This invention may, however, be embodied in different forms and should not be construed as limited to the embodiments set forth herein. Rather, these embodiments are provided so that this disclosure is thorough and complete, and fully conveys the inventive aspects to those skilled in the art. In the drawings, the thicknesses of layers and regions are exaggerated for clarity. Like numbers refer to like elements throughout the specification.

FIG. 1 is a sectional diagram that illustrates a MOS transistor with an asymmetric channel region according to some embodiments of the invention.

Referring to FIG. 1, an active region 12 is defined in a semiconductor substrate 10. The active region 12 may be defined by an isolation layer (not shown). A channel trench 14 is disposed in the semiconductor substrate 10 of the active region 12. The channel trench 14 is disposed to have a predetermined depth from a main surface S of the semiconductor substrate 10 and to cross the active region 12. A gate insulating layer 18 is disposed to cover an inner wall of the channel trench 14. The gate insulating layer 18 may be a silicon oxide layer formed by a thermal oxidation method. A gate electrode 16 is disposed on the semiconductor substrate having the channel trench 14. The gate electrode 16 fills the channel trench 14 and protrudes above the main surface S of the semiconductor substrate. The gate electrode 16 may be made of polysilicon and, preferably has a stacked structure that includes a polysilicon pattern 16a and a metal silicide pattern 16b, as shown in FIG. 1. The metal silicide pattern 16b may be, for example, a tungsten silicide pattern.

Source/drain regions 20 of a first conductivity type are disposed in the active region 12 at both sides of the channel trench 14. In some embodiments of the invention, the source/drain regions 20 may be N-type impurity regions. A channel impurity region 22 is disposed beneath one of the source/drain regions 20 and in contact with at least a sidewall of the channel trench 14. That is, the channel impurity region 22 is in contact with a lower surface of one of the source/drain regions 20 and in contact with a sidewall of the channel trench 14. The channel impurity region 22 is of a second conductivity type.

When the source/drain regions 20 are N type impurity regions, the channel impurity region 22 may be a P type impurity region. The channel impurity region 22 prevents a threshold voltage of the MOS transistor from being reduced due to a short channel effect.

A low concentration impurity region 24 is disposed in the active region beneath the other one of the source/drain regions 20. The low concentration impurity region 24 is preferably of the same conductivity type as the source/drain regions 20 and has an impurity concentration that is lower than that of the source/drain regions 20.

When the MOS transistor operates, a channel region 26 exists along the sidewall and a bottom surface of the channel trench 14. The channel region 26 extends up the sidewall of the channel trench 14 to a lower surface of the low concentration impurity region 24.

Thus, as described above, the channel impurity region 22 is asymmetrically disposed beneath one of the source/drain regions 20. As a result, impurity regions formed in the active region 12 at both sides of the gate electrode 16 have an asymmetric junction profile. That is, an abrupt and shallow junction is formed at one side of the active region 12 where the channel impurity region 22 is disposed while a gradual and deep junction is formed at the other side where the low concentration impurity region 24 is disposed. Furthermore, the channel impurity region 22 is asymmetrically disposed at one side of the channel region 26.

When information corresponding to a high state (e.g., logic "1") is stored in the capacitor and source/drain junction connected to the capacitor exhibits a poor leakage current characteristic, charges stored in the capacitor can be lost due to the high leakage current that flows through a junction of the source/drain region 20 connected to the capacitor. In this case, a refresh cycle of a DRAM device having the leaky junction connected to the capacitor should be increased in order to prevent the data stored in the capacitor from being changed to a low state (e.g., logic "0"). If the refresh cycle of the DRAM device is increased, power consumption of the DRAM device is also increased. Accordingly, the low concentration impurity region 24 having the same conductivity type as the source/drain regions 20 is preferably provided beneath the source/drain region 20 connected to the capacitor in order to lower the leakage current level of the source/drain junction connected to the capacitor and to improve the refresh characteristic of the DRAM device.

On the contrary, the junction leakage current of the source/drain region 20 connected to a bit line is less critical as compared to the junction leakage current of the source/drain region 20 connected to the capacitor. In other words, even though the junction leakage current of the source/drain region 20 connected to the bit line is higher than that of the source/drain region 20 connected to the capacitor and the data corresponding to the high state is stored in the capacitor, the charges in the capacitor may not be lost for a long time if the MOS transistor is turned off and the source/drain region 20 connected to the capacitor exhibits an excellent junction leakage current characteristic. Hence, the channel impurity region 22 that has the same conductivity type as the substrate 10 and may cause a high junction leakage current is preferably provided below the source/drain region 20 connected to the bit line in order to maintain a specific threshold voltage of the MOS transistor.

In conclusion, by forming the channel impurity region 22 and the low concentration impurity region 24, it is possible to minimize problems caused by the leakage current and also prevent the threshold voltage from being reduced due to the short channel effect.

For example, when the MOS transistor is used for a DRAM cell, the channel impurity region 22 is preferably disposed beneath the source/drain region 20 that is electrically connected to a bit line. The low concentration impurity region 24 may alternatively be disposed beneath a source/drain region 20 that is electrically connected to a capacitor, so that a gradual and deep junction is formed.

Figure 2:
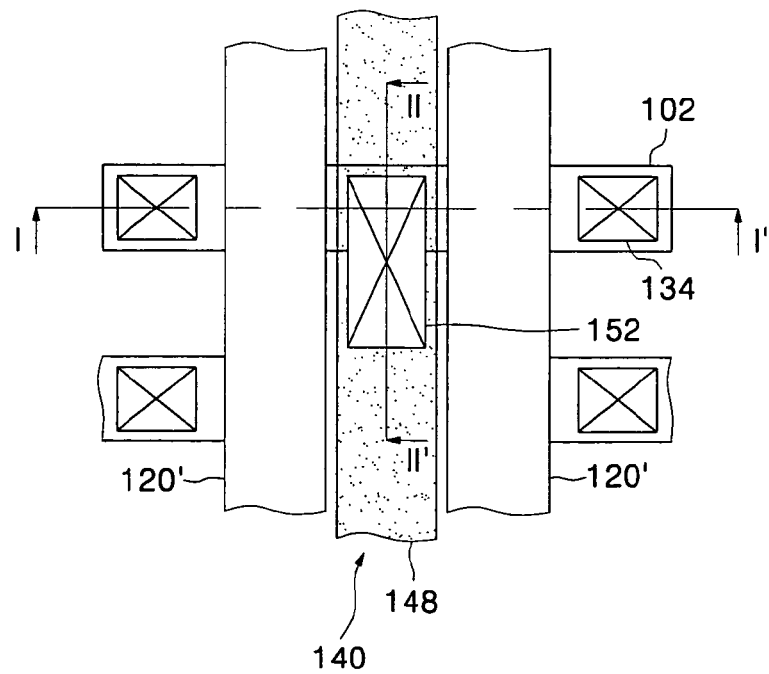
FIG. 2 is a plan diagram that partially illustrates a cell array of a DRAM device according to some embodiments of the invention.

FIG. 2 is a plan diagram that partially illustrates a cell array of a DRAM device according to some embodiments of the invention, and FIGS. 3A to 11B are sectional diagrams that illustrate a method of fabricating the cell array of FIG. 2. FIGS. 3A, 4A, 5, 6, 7, 8A, 9A, 10A, and 11A are sectional diagrams taken along the line I-I' of FIG. 2, while FIGS. 3B, 4B, 8B, 9B, 10B, and 11B are sectional diagrams taken along the line II-II' of FIG. 2.

Figure 11A:
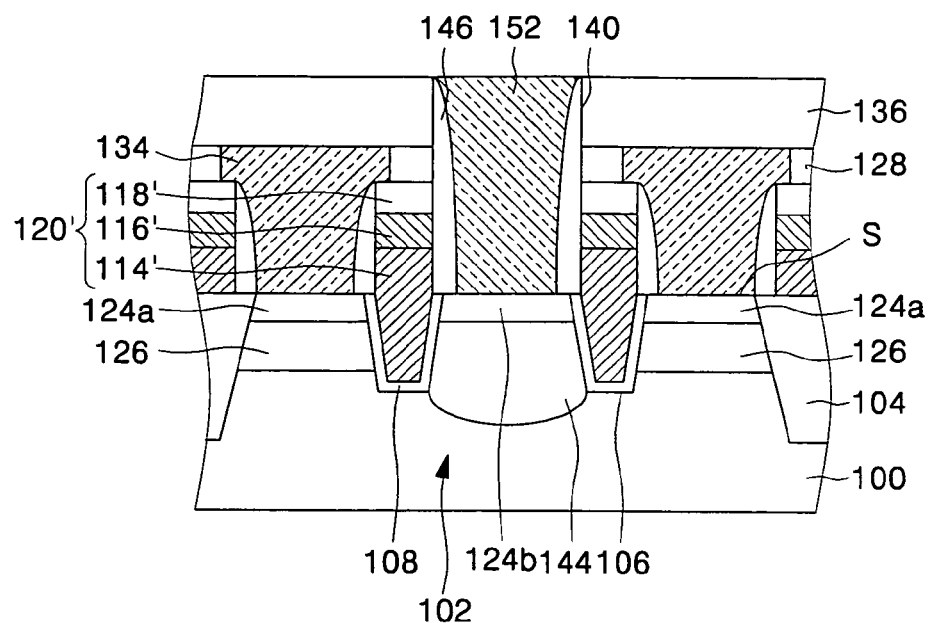
Figure 11B:
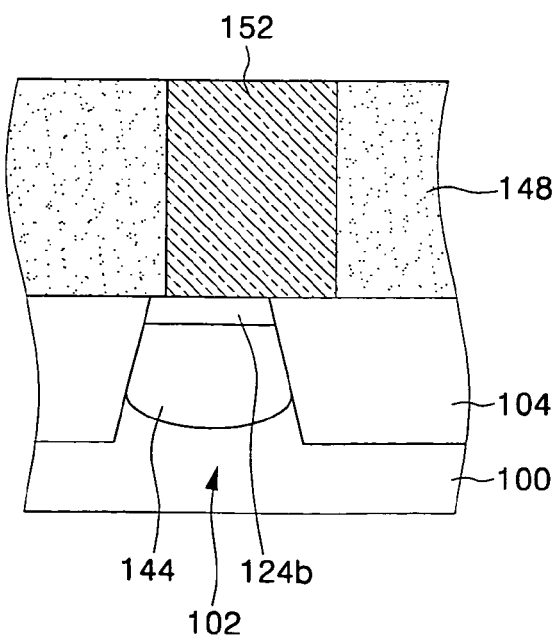

Referring to FIGS. 2, 11A, and 11B, an active region 102 is defined in a semiconductor substrate 100. The active region 102 may be defined by an isolation layer 104. Channel trenches 106 are disposed in the active region 102 of the semiconductor substrate 100. The channel trenches 106 are disposed to have a predetermined depth from a main surface S of the semiconductor substrate 100 and to cross the active region 102. A gate insulating layer 108 is disposed to cover inner walls of the channel trenches 106. The gate insulating layer 108 may be a silicon oxide layer formed by a thermal oxidation method. Gate patterns 120' are disposed on the semiconductor substrate having the channel trenches 106. The gate patterns 120' fill the channel trenches 106 and extend above the main surface S of the semiconductor substrate. The gate patterns 120' are also spaced apart from each other on the main surface S of the semiconductor substrate. Each of the gate patterns 120' may include a first gate conductive layer pattern 114', a second gate conductive layer pattern 116', and a capping layer pattern 118', which are sequentially stacked. The first gate conductive layer pattern 114' may be polysilicon layer pattern, and the second gate conductive layer pattern 116' may be a metal silicide layer pattern, such as a tungsten silicide layer pattern. The capping layer pattern 118' may be a silicon nitride layer pattern. In some embodiments, the second gate conductive layer pattern 116' may be omitted.

A drain region 124b is disposed in the active region 102 between the channel trenches 106. Source regions 124a are disposed in the active region and separated from the drain region 124b by the channel trenches 106. The drain region 124b and the source regions 124a may be diffusion layers containing N-type impurity ions. A channel impurity region 144 is disposed in the active region 102 beneath the drain region 124b. The channel impurity region 144 is in contact with, at least, sidewalls of the channel trenches 106. The channel impurity region 144 has an opposite conductivity compared to the drain region 124b and the source regions 124a. The channel impurity region 144 may be a diffusion layer containing P-type impurity ions and prevents the threshold voltage of a cell transistor, which constitutes the DRAM device, from being reduced due to short channel effects. Preferably, low concentration impurity regions 126 are disposed in the active region 102 beneath the source regions 124a. The low concentration impurity regions 126 preferably have the same conductivity as the source regions 124a, and preferably have an impurity concentration that is lower than that of the source regions 124a.

A first interlayer insulating layer 128 is disposed on the semiconductor substrate having the source regions 124a, the drain region 124b, and the channel impurity region 144. The first interlayer insulating layer 128 covers the gate patterns 120'. Buried contact (BC) plugs 134 are disposed in the first interlayer insulating layer 128', which each are in contact with the source regions 124a through the first interlayer insulating layer 128'. The BC plugs 134 may be formed of polysilicon or metal, such as tungsten. Although not shown in the figure, the BC plugs 134 are electrically connected to the capacitor. A second interlayer insulating layer 136 covers the first interlayer insulating layer 128 and the BC plugs 134. An inter-gate groove 140 passes through the second interlayer insulating layer 136 and the first interlayer insulating layer 128 to expose the sidewalls of the gate patterns 120' at both sides of the drain region 124b and to expose upper surfaces of the drain region 124b. The inter-gate groove 140 is subsequently filled with a filling dielectric layer 148. The filling dielectric layer 148 is preferably a spin on glass (SOG) layer having excellent gap filling properties. A direct contact (DC) plug 152 is in contact with the drain region 124b through the filling dielectric layer 148. The DC plug 152 is formed of polysilicon or metal, such as tungsten. Although not shown, the DC plug 152 is also electrically connected to a bit line.

A method of fabricating the DRAM device according to some embodiments of the invention will be described below with reference to FIGS. 3A to 11B.

Figure 3A:
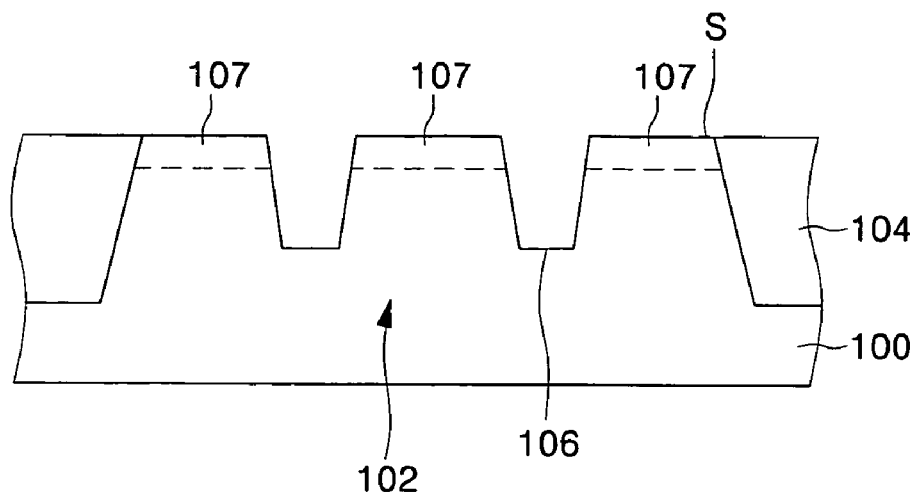
FIGS. 3A to 11B are sectional diagrams that illustrate a method of fabricating the cell array of FIG. 2.
Figure 3B:
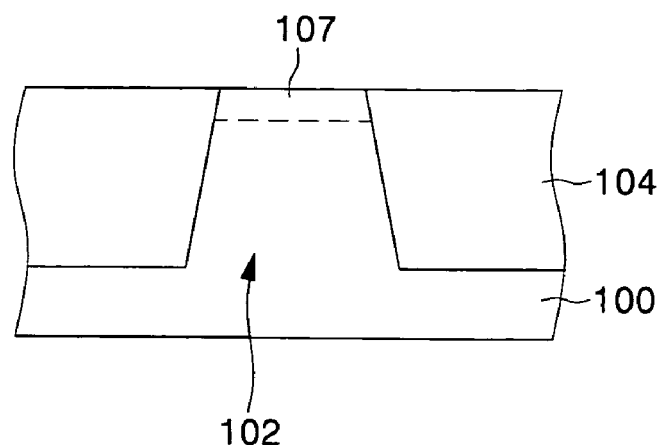

Referring to FIGS. 2, 3A, and 3B, an isolation layer 104 is formed to define an active region 102 in a semiconductor substrate 100. The isolation layer 104 may be formed by a conventional shallow trench isolation (STI) process. At least two channel trenches 106, which cross the active region 102 and are spaced apart from each other, are then formed in the semiconductor substrate 100. More specifically, a mask pattern (not shown) having openings to expose predetermined regions of the active region 102 is formed on the semiconductor substrate 100 having the isolation layer 104. The mask pattern may be a hard mask pattern formed of silicon nitride, or the mask pattern may be a photoresist pattern. Subsequently, the semiconductor substrate 100 is anisotropically etched using the mask pattern as an etch mask to form the channel trenches 106, which cross the active region and are recessed from a main surface S of the semiconductor substrate 100 by a predetermined depth.

Preferably, pre-doped layers 107 may be formed in the active region 102 by implanting N type impurity ions into the entire surface of the semiconductor substrate 100 using the isolation layer 104 as an ion implantation mask, before the channel trenches 106 are formed. The pre-doped layers 107 are formed to prevent the source and drain regions, which are formed in subsequent processes, from being spaced apart from the channel trenches 106.

Figure 4A:
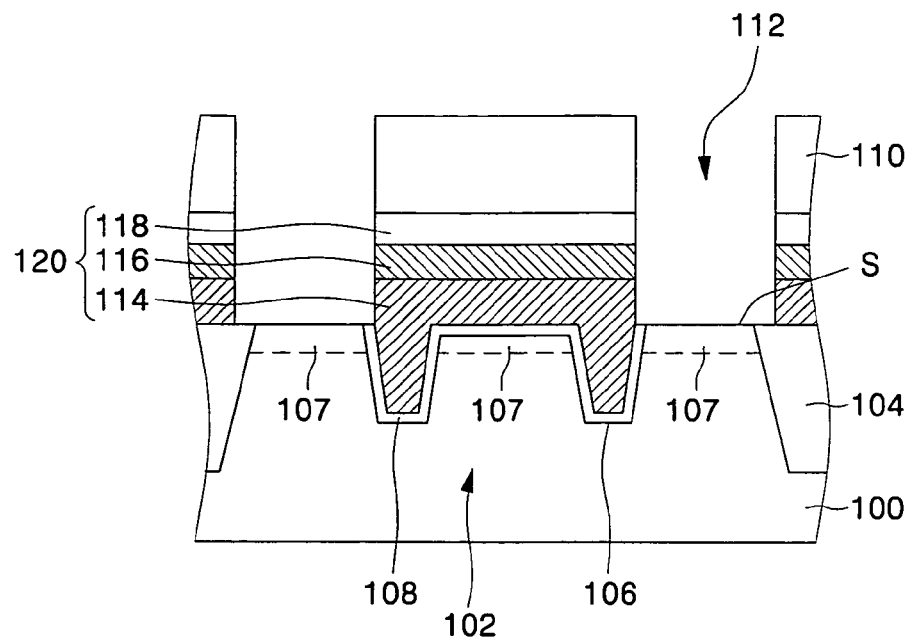
Figure 4B:
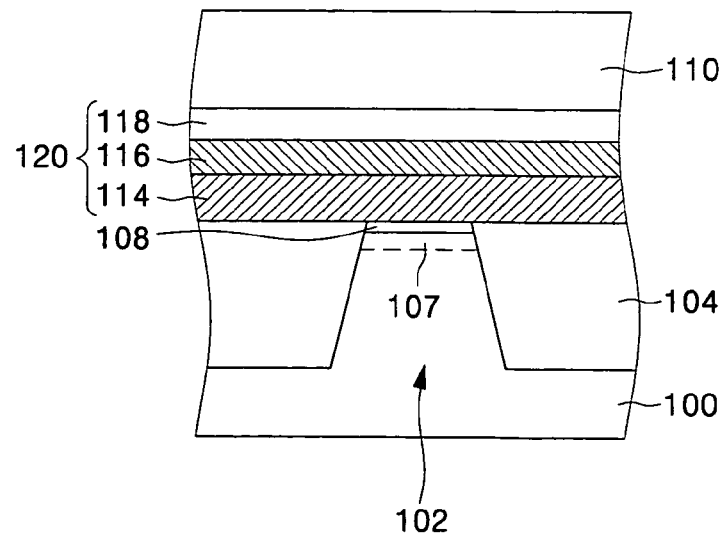

Referring to FIGS. 2, 4A, and 4B, a gate insulating layer 108 is formed to cover inner walls of the channel trenches 106 and a surface of the active region 102. The gate insulating layer 108 may be a silicon oxide layer formed by a thermal oxidation method. A first gate conductive layer (the layer that includes numbered layer 114), a second gate conductive layer (the layer that includes numbered layer 116), and a capping layer (the layer that includes numbered layer 118) are sequentially formed on a surface of the semiconductor substrate 100 having the gate insulating layer 108. The first gate conductive layer fills the channel trenches 106 and extends to a predetermined height above the main surface S of the semiconductor substrate 100. The first gate conductive layer may be formed of a polysilicon layer, and the second gate conductive layer may be formed of a metal silicide layer, such as a tungsten silicide layer. In alternative embodiments, the second gate conductive layer may be omitted. The capping layer may be formed of a silicon nitride layer.

A first photoresist pattern 110 is deposited on the capping layer 118. An opening 112 is formed in the first photoresist pattern 110, the opening overlapping the active region 102 in a region between the channel trenches 106 and at least the edge of the isolation layer 104. The capping layer, the second gate conductive layer, and the first gate conductive layer are then anisotropically etched using the first photoresist pattern 110 as an etch mask. As a result, as shown in FIG. 4A, a preliminary gate pattern 120 fills the channel trenches 106 and extends over the main surface S of the semiconductor substrate 100, and also covers the active region between the channel trenches. The preliminary gate pattern 120 includes a first preliminary gate conductive layer pattern 114, a second preliminary gate conductive layer pattern 116, and a preliminary capping layer pattern 118, which are sequentially stacked. Meanwhile, the gate insulating layer 108 in the portion exposed by the first photoresist pattern 110 may be etched while the preliminary gate pattern 120 is formed.

Figure 5:
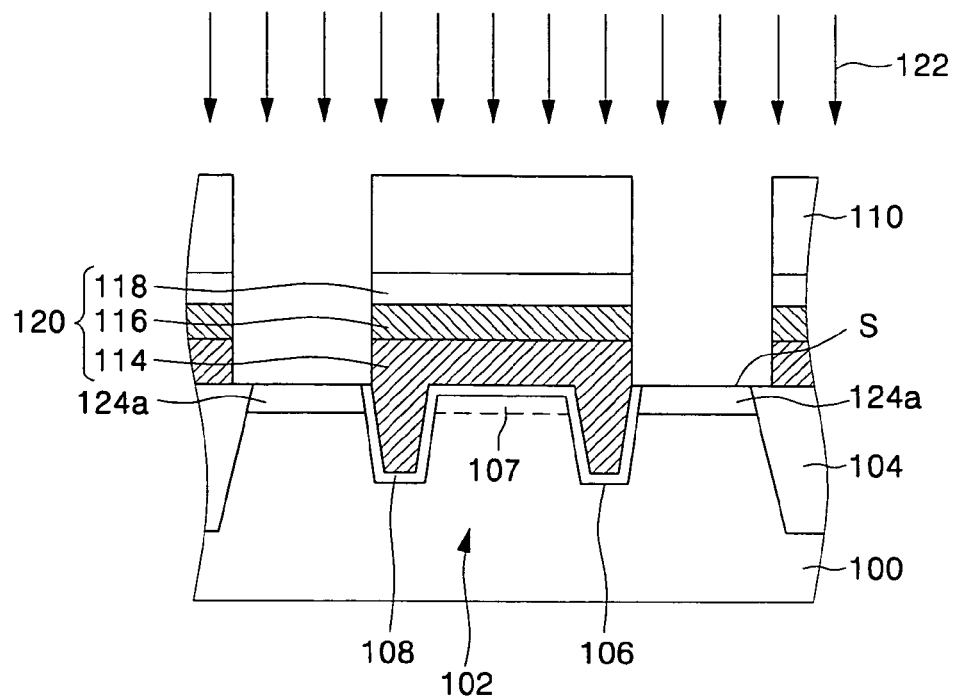
Figure 6:
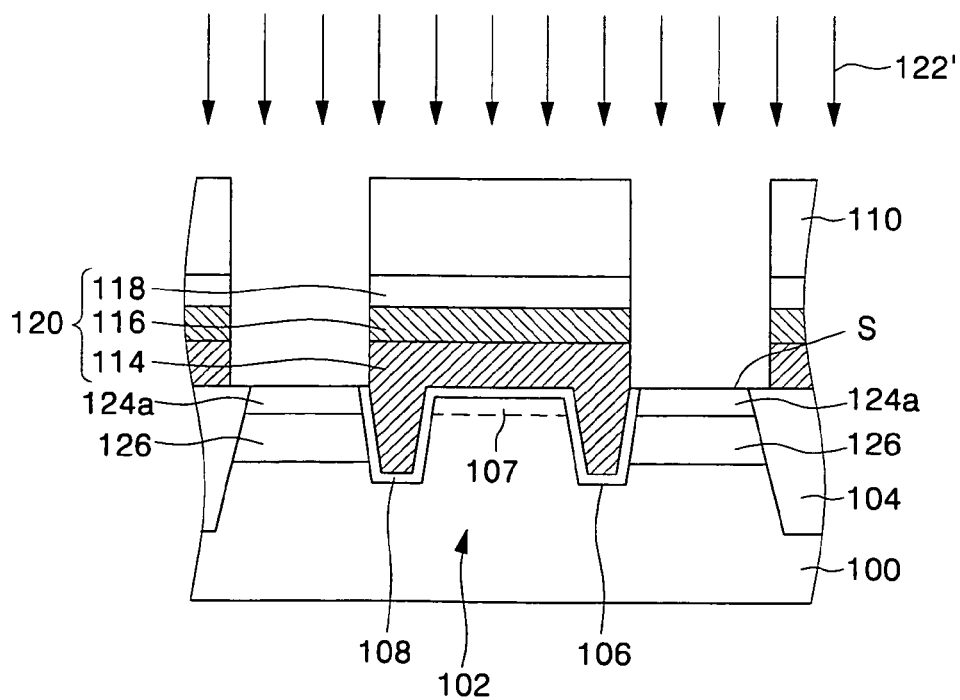

Referring to FIGS. 2, 5, and 6, source regions 124a are formed in the active region 102 at both sides of the preliminary gate pattern 120 by implanting N type impurity ions 122 into the semiconductor substrate having the preliminary gate pattern 120. Preferably, a process of implanting impurity ions having the same conductivity as the source regions 124a, namely, N type impurity ions 122' into the semiconductor substrate having the preliminary gate pattern 120, may be further performed before or after the source regions 124a are formed. It is desirable that this process is performed under conditions of higher implantation energy and lower impurity ion concentration compared with the impurity ion implantation process for forming the source regions 124a. As a result, low concentration impurity regions 126 are formed in the active region 102 beneath the source regions 124a. Meanwhile, the process of implanting the impurity ions 122 and 122' may be performed using the first photoresist pattern 110 as an ion implantation mask. Alternatively, it may be performed using the preliminary gate pattern 120 as an ion implantation mask after removing the first photoresist pattern 110.

Figure 7:
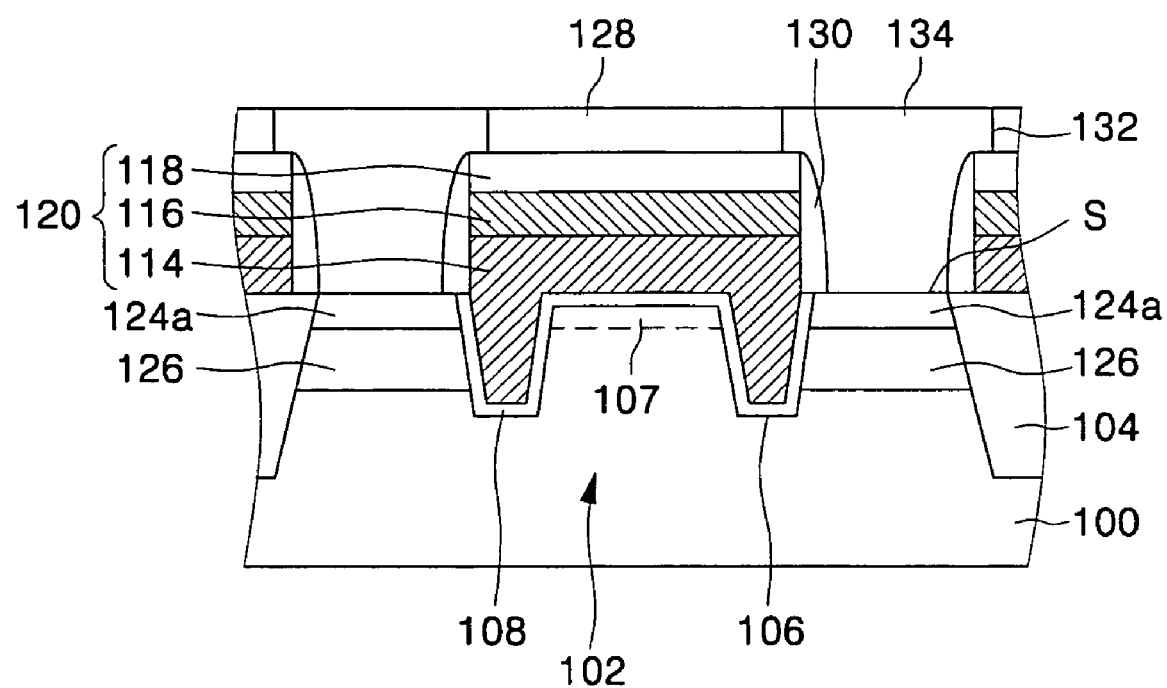

Referring to FIGS. 2 and 7, the first photoresist pattern 110 is removed. The first photoresist pattern 110 may be removed by a well known ashing process. A gate spacer 130 is formed to cover a sidewall of the preliminary gate pattern 120. The gate spacer 130 may be a silicon nitride layer. A first interlayer insulating layer 128 is then formed over a surface of the semiconductor substrate 100 to cover the preliminary gate pattern 120. Buried contact (BC) holes 132 exposing the source regions 124a are formed by patterning the first interlayer insulating layer 128. The BC holes 132 may be formed using a self-aligned contact technique. Subsequently, a conductive layer is formed to fill the BC holes 132. The conductive layer may be a polysilicon layer or a metal layer, for example, a tungsten layer. BC plugs 134 are formed by planarizing the conductive layer until a top surface of the first interlayer insulating layer 128 is exposed. The BC plugs 134 are electrically connected to the source regions 124a.

Figure 8A:
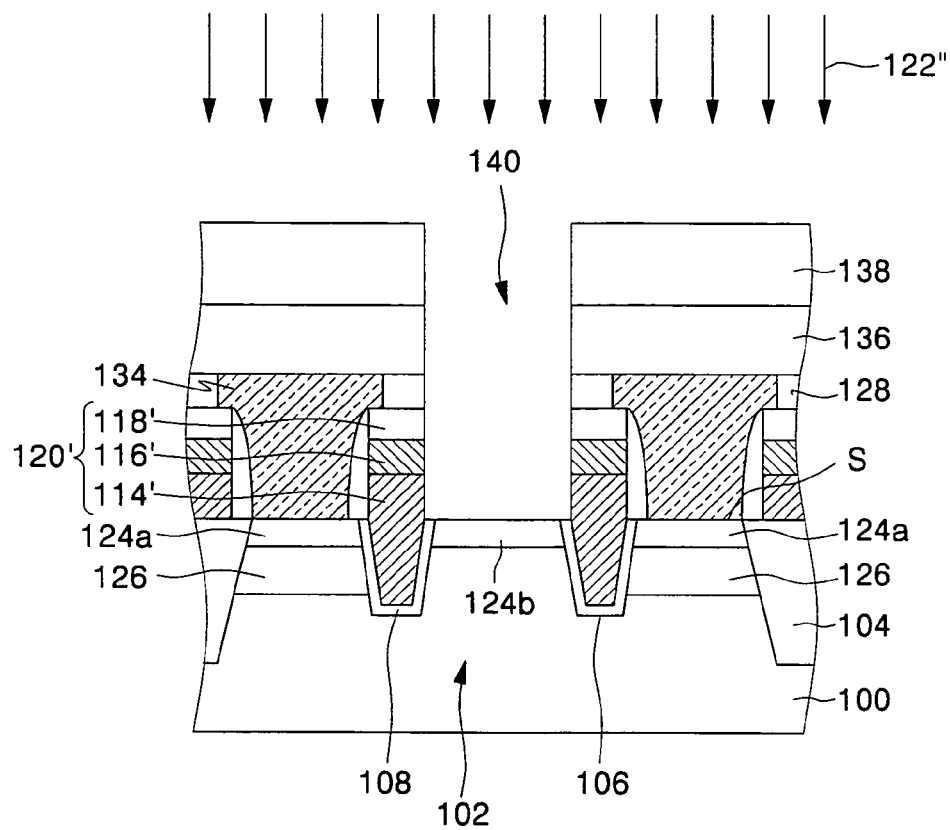
Figure 8B:
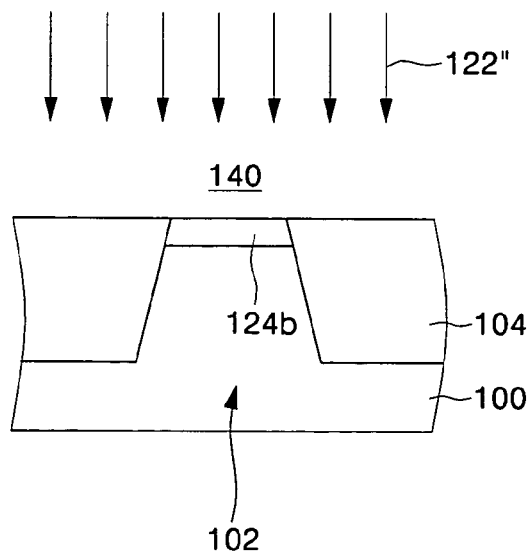

Referring to FIGS. 2, 8A, and 8B, a second interlayer insulating layer 136 is formed on the first interlayer insulating layer 128 and the BC plugs 134. A second photoresist pattern 138 having an opening in a predetermined region is formed on the second interlayer insulating layer 136. An inter-gate groove 140 is formed to expose an active region between the channel trenches 106 by anisotropically etching the second interlayer insulating layer 136, the first interlayer insulating layer 128, and the preliminary gate pattern 120 in sequence using the second photoresist pattern 138 as an etch mask. Thus, gate patterns 120' that are separated by the inter-gate groove 140 are simultaneously formed. Each of the gate patterns 120' includes a first gate conductive layer pattern 114', a second gate conductive layer pattern 116', and a capping layer pattern 118', which are sequentially stacked. A drain region 124b is then formed by implanting N type impurity ions 122" into the active region 102, which has been exposed by the inter-gate groove 140.

Figure 9A:
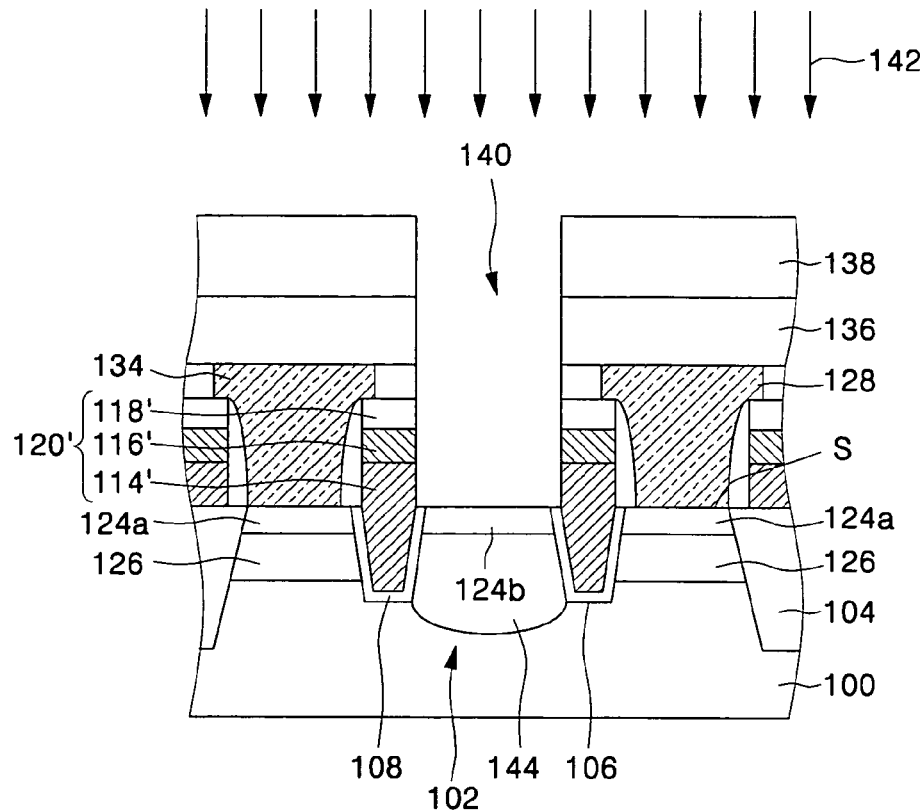
Figure 9B:
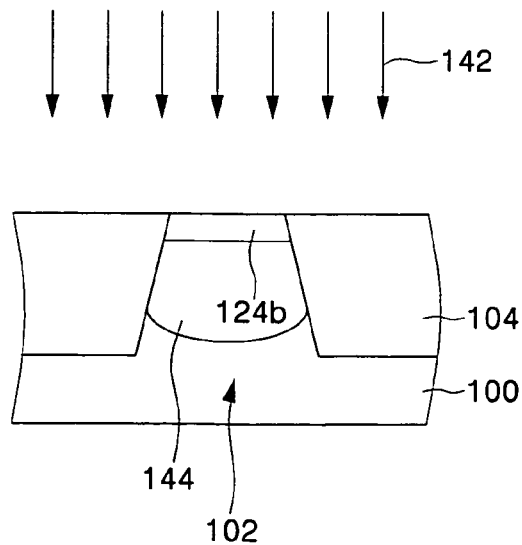

Referring to FIGS. 2, 9A, and 9B, after the drain region 124b is formed, a channel impurity region 144 is formed beneath the drain region 124b by implanting P type impurity ions 142 into the active region, which has been exposed by the inter-gate groove 140. The channel impurity region 144 is preferably in contact with at least a sidewall of each of the channel trenches 106.

In alternative embodiments, the process of implanting the N type impurity ions 122", as illustrated in FIGS. 8A and 8B, and the process of implanting the P type impurity ions 142, as illustrated in FIGS. 9A and 9B, may be performed in a reverse order. In other words, in some embodiments the first channel impurity region 144 is formed before the drain region 124b. The processes of implanting the impurity ions 122" and 142 may be performed using the second photoresist pattern 138 as an ion implantation mask. Alternatively, it may be performed using the second interlayer insulating layer 136 as an ion implantation mask after removing the second photoresist pattern 138.

Figure 10A:
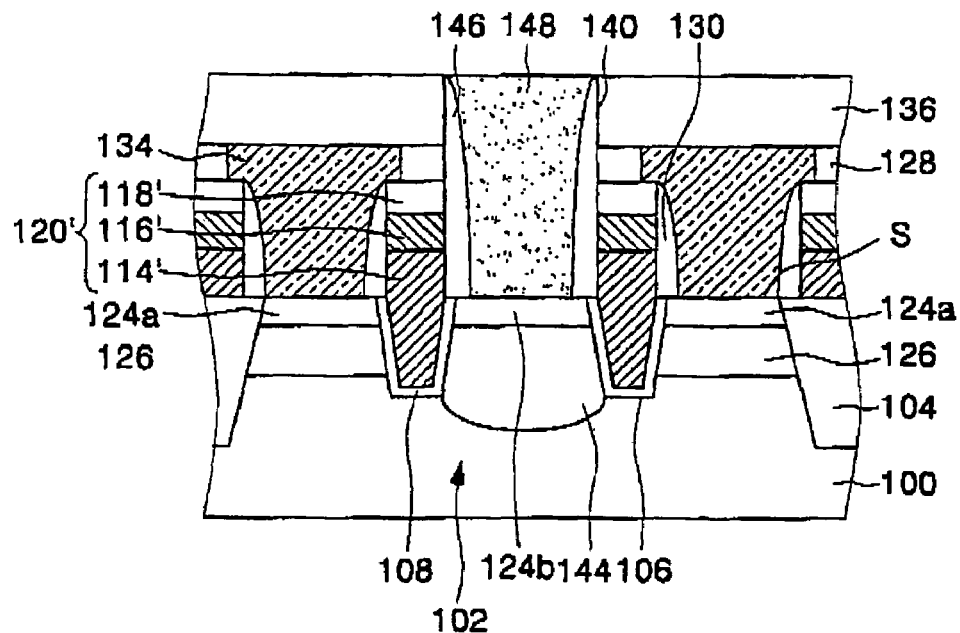
Figure 10B:
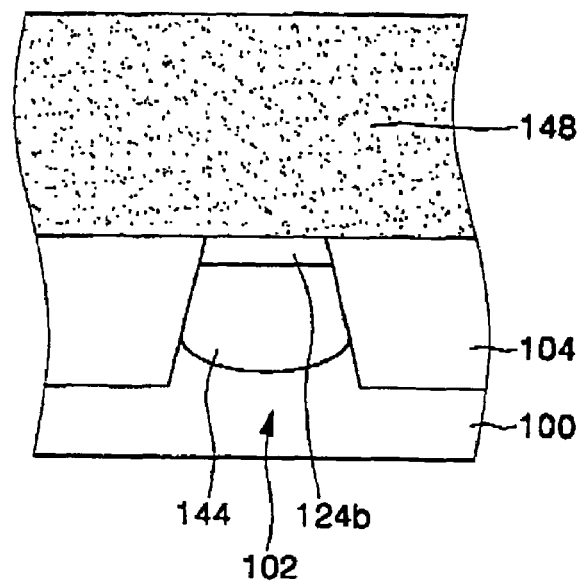

Referring to FIGS. 2, 10A, and 10B, after removing the second photoresist pattern 138, a groove spacer 146 is then formed to cover the sidewall of the inter-gate groove 140. The second photoresist pattern 138 may be removed by using a conventional ashing process. The groove spacer 146 may be formed of a silicon nitride layer. As shown in FIG. 10A, the groove spacer 146 is formed to have an asymmetrical relationship with the gate spacer 130 that is located on the opposite side of the gate pattern 120'. A filling dielectric layer 148 is then formed to fill the inter-gate groove 140. The filling dielectric layer 148 is preferably formed of a layer with excellent gap filling properties, such as a SOG layer.

Referring to FIGS. 2, 11A, and 11B, a direct contact (DC) hole 150 is formed to expose the drain region 124b by patterning the filling dielectric layer 148. Subsequently, a conductive layer is formed to fill the DC hole 150. The conductive layer may be formed of a polysilicon layer or a metal layer, such as a tungsten layer. A DC plug 152 is formed by planarizing the conductive layer until the top surface of the second interlayer insulating layer 136 is exposed. The DC plug 152 is electrically connected to the drain region 124b. Thereafter, although not shown in the figures, a process of forming a bit line electrically connected to the DC plug 152 and a process of forming a capacitor electrically connected to the BC plug 134 may be additionally performed.

As described above, according to some embodiments of the invention, the source regions 124a are first formed, then the drain region 124b and the channel impurity region 144 are formed using the inter-gate groove 14, which was formed through the anisotropic etching process for forming the gate patterns 120'. As a result, impurity regions having an asymmetric conductivity may be formed in the active region at both sides of the channel trenches 106 without performing an additional photolithography process. That is, a gradual and deep junction is formed at the source regions 124a connected to the capacitor, so that deterioration of the refresh characteristic due to the leakage current is minimized. On the other hand, the channel impurity region 144 is formed at the drain region 124b connected to the bit line, so that the threshold voltage may be prevented from being reduced due to the short channel effect.

Figure 12:
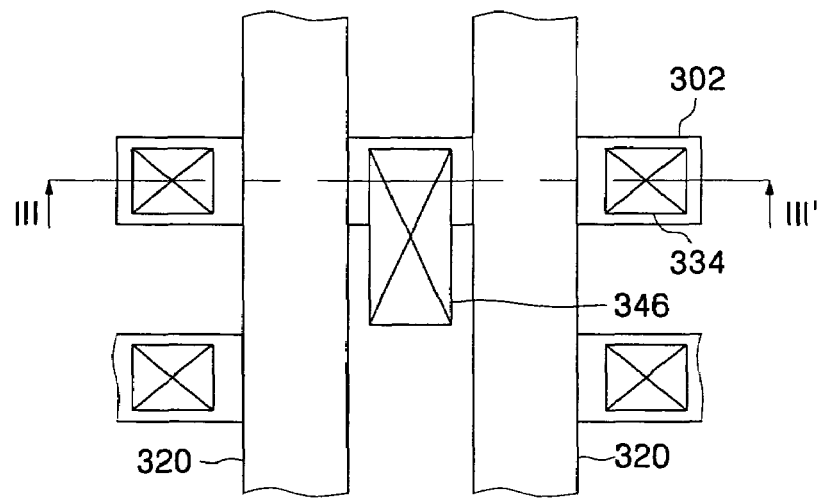
FIG. 12 is a plan diagram that partially illustrates a cell array of a DRAM device according to other embodiments of the invention.

FIG. 12 is a plan diagram that partially illustrates a cell array of a DRAM device according to other embodiments of the invention. FIGS. 13 to 19 are sectional diagrams that illustrate a method of fabricating the DRAM device of FIG. 12. FIGS. 13-19 are sectional diagrams that are taken along the line III-III' of FIG. 12.

Figure 19:
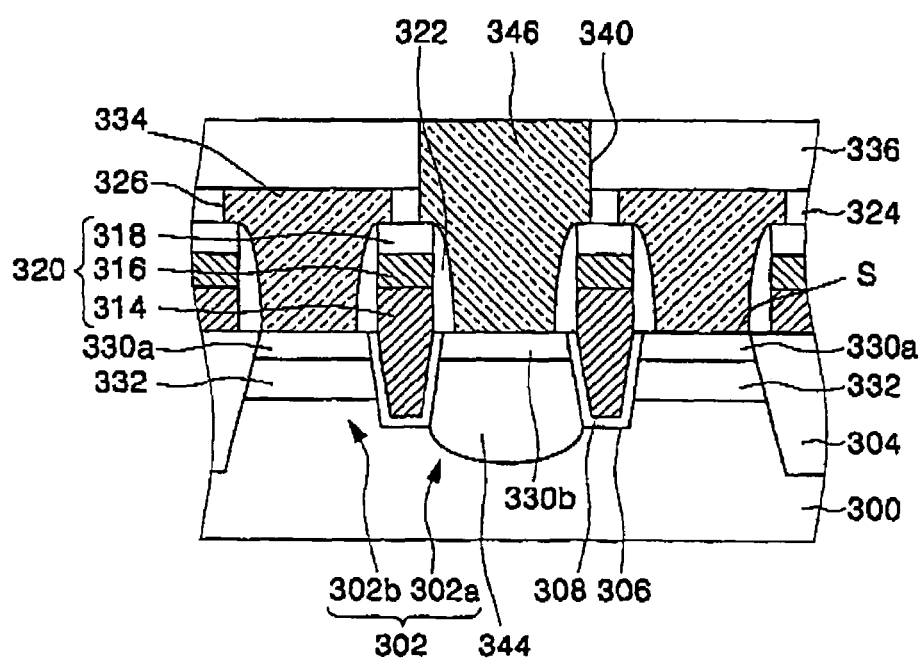

Referring to FIGS. 12 and 19, an active region 302, channel trenches 306, gate patterns 320, a gate insulating layer 308, source regions 330a, low concentration impurity regions 332, a drain region 330b, and channel impurity region 344 are disposed on a semiconductor substrate 300. The structure and arrangement of these features are the same as described above with respect to FIGS. 2-11. The following description will focus on the features of these embodiments that are different than the embodiments of FIGS. 2-11.

Gate spacers 322 are disposed to cover both sidewalls of the gate patterns 320. A first interlayer insulating layer 324 is disposed on the semiconductor substrate having the gate patterns 320. The first interlayer insulating layer 324 is disposed to cover the gate patterns 320. BC plugs 334, which are in contact with the source regions 330a through the first interlayer insulating layer 324, is disposed in the first interlayer insulating layer 324. Although not shown in the figures, the BC plugs 334 are electrically connected to the capacitor. A second interlayer insulating layer 336 is disposed to cover the first interlayer insulating layer 324 and the BC plugs 334. A DC plug 346, which is disposed to pass through the second interlayer insulating layer 336 and the first interlayer insulating layer 324, is in contact with the drain region 330b. Although not shown in the figures, the DC plug 346 is electrically connected to a bit line.

According to these embodiments of the invention, the inter-gate groove 140, the groove spacer 146, and the filling dielectric layer 148 of the previous embodiments are unnecessary. Thus, a simpler structure may be used to achieve the same effect.

A method of fabricating a DRAM device according to these other embodiments of the invention is described below with reference to FIGS. 13 to 19.

Figure 13:
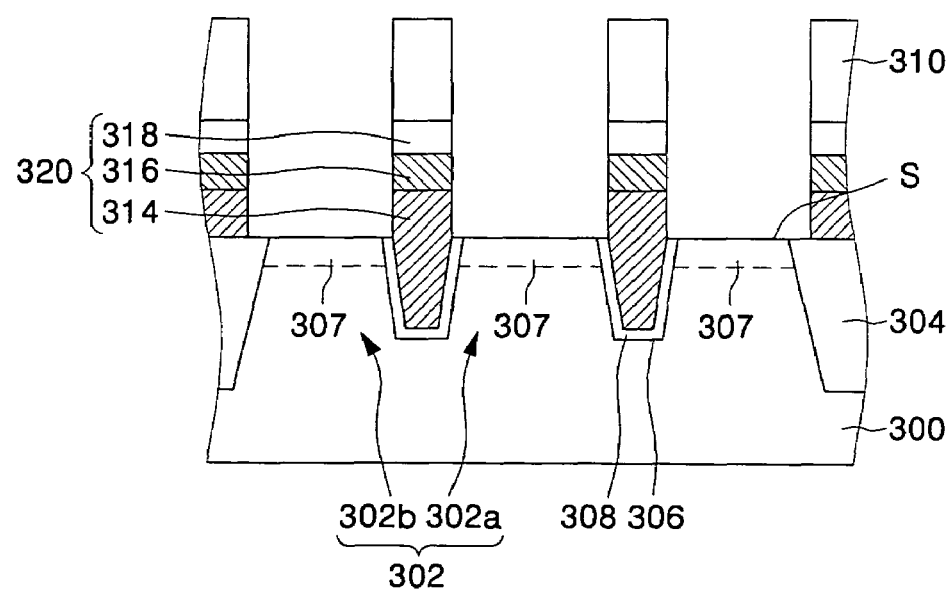
FIGS. 13 to 19 are sectional diagrams that illustrate a method of fabricating the cell array of FIG. 12.

Referring to FIGS. 12 and 13, an isolation layer 304 is formed to define an active region 302 in a semiconductor substrate 300. Channel trenches 306 are then formed to cross the active region 302 by performing the same process as was described with reference to FIGS. 2-11. As a result, a first sub-active region 302a between the channel trenches 306a and a second sub-active region 302b spaced apart from the first sub-active region 302a by the channel trenches 306 are defined. Preferably, pre-doped layers 307 may be formed in the active region 302 by implanting N type impurity ions into a surface of the semiconductor substrate 300 using the isolation layer 304 as an ion implantation mask, before forming the channel trenches 306. A gate insulating layer 308 is then formed to cover inner walls of the channel trenches 306 and the surface of the active region 302. A first gate conductive layer (the layer that includes numbered layer 314), a second gate conductive layer (the layer that includes numbered layer 316), and a capping layer (the layer that includes numbered layer 318) are sequentially formed on a surface of the semiconductor substrate 300 having the gate insulating layer 308. A first photoresist pattern 310 with an opening in a predetermined region is then formed on the capping layer. The capping layer, the second gate conductive layer, and the first gate conductive layer are anisotropically etched in sequence using the first photoresist pattern 310 as an etch mask. As a result, as shown in FIG. 13, gate patterns 320 are formed to fill the trenches and extend over the main surface S of the semiconductor substrate 100, and are spaced from each other on the main surface S of the semiconductor substrate 100.

According to these embodiments of the invention, unlike the embodiments that were described in FIGS. 2-11, the gate patterns 320 are formed without first forming the preliminary gate pattern. Each of the gate patterns 320 includes a first gate conductive layer pattern 314, a second gate conductive layer pattern 316, and a capping layer pattern 318, which are sequentially stacked. Meanwhile, the gate insulating layer 308 in a portion exposed by the first photoresist pattern 310 may be etched while the gate patterns 320 are formed.

Figure 14:
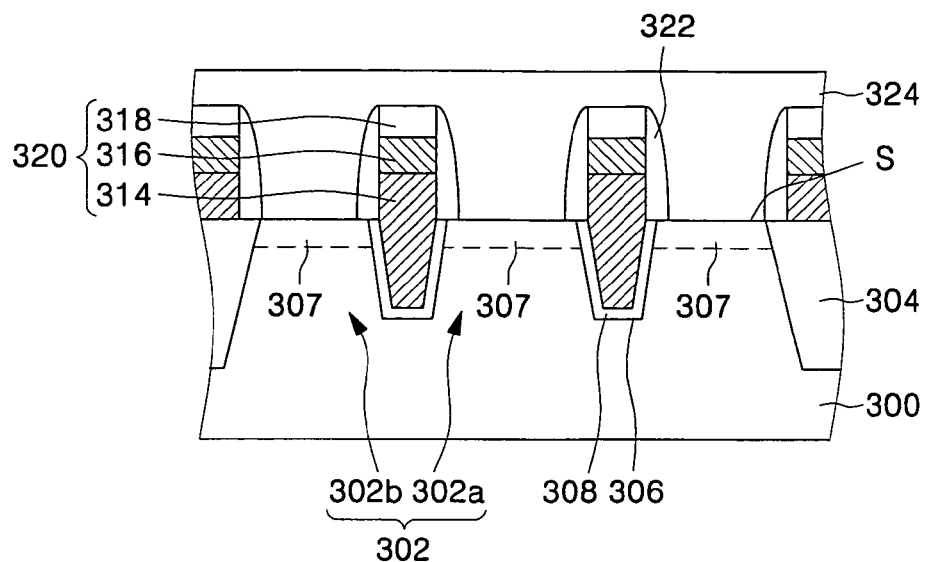

Referring to FIGS. 12 and 14, the first photoresist pattern 310 is first removed. Thereafter, gate spacers 322 are formed to cover sidewalls of the gate patterns 320. The gate spacers 322 may be formed of a silicon nitride layer. A first interlayer insulating layer 324 is then formed on a surface of the semiconductor substrate 300 to cover the gate patterns 320.

Figure 15:
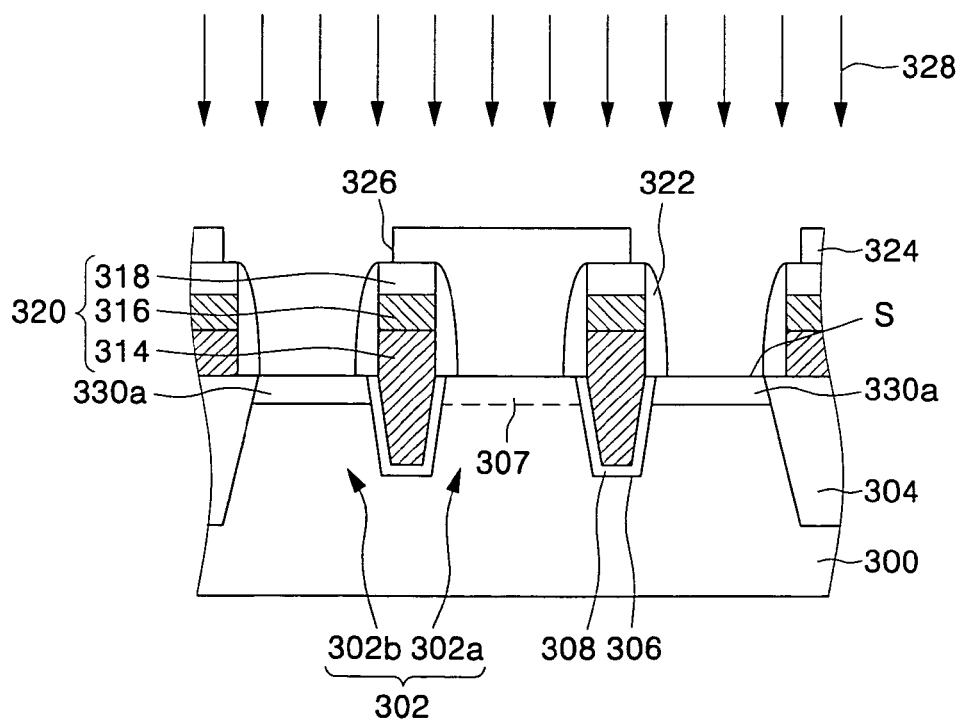
Figure 16:
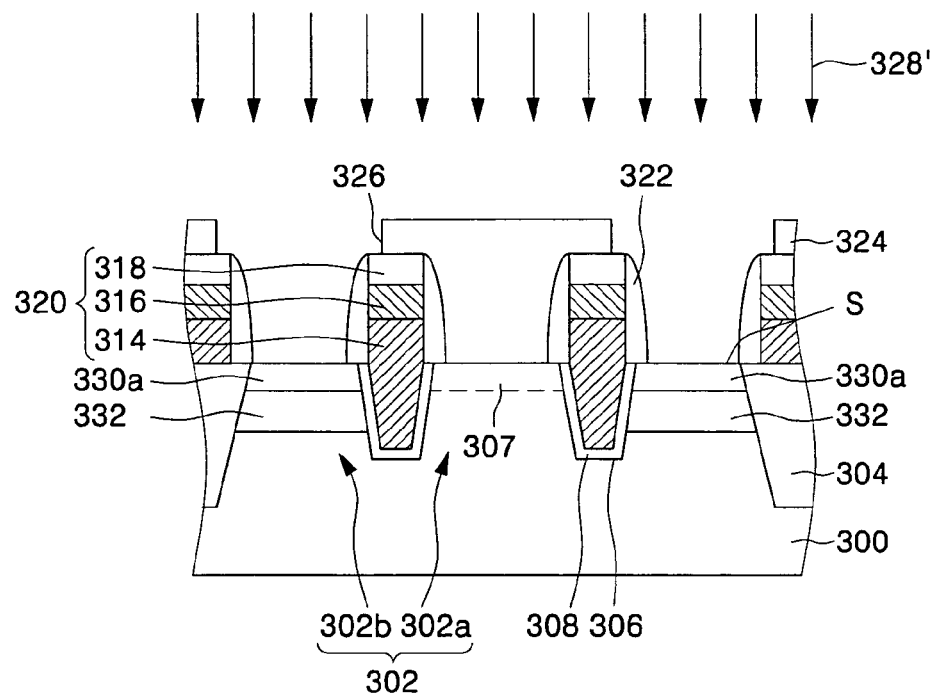

Referring to FIGS. 12, 15, and 16, BC holes 326 which expose the second sub-active regions 302*b* are formed by patterning the first interlayer insulating layer 324. The BC holes 326 may be formed using a self-aligned contact technique. As shown in FIG. 15, the first sub-active region 302*a* is not exposed in this process and is kept covered with the first interlayer insulating layer 324. Source regions 330*a* and an optional low concentration impurity region 332 are then formed in the second sub-active region 302*b* by performing the same processes as describe above for the embodiments of FIG. 2-11. These processes include a process of implanting N type impurity ions 328 at a high concentration to form the source regions 328*a*, and a process of implanting N type impurity ions 328' at a low concentration to form the low concentration impurity region 332.

Figure 17:
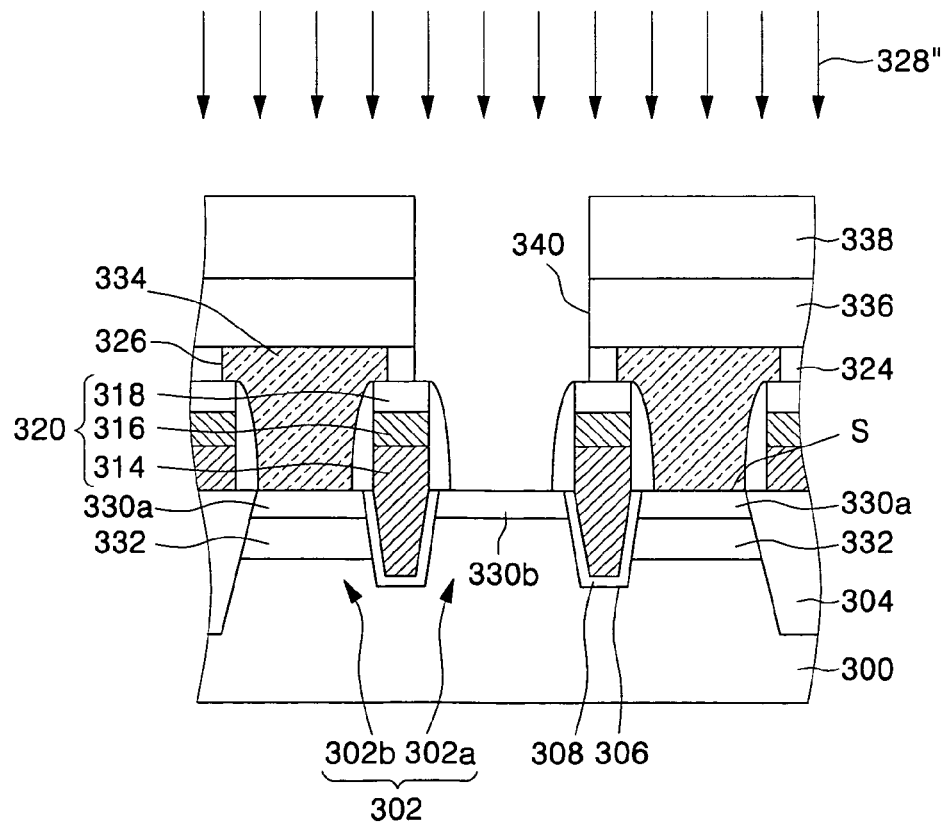

Referring to FIGS. 12 and 17, BC plugs 334 are formed to fill the BC holes 326. A second interlayer insulating layer 336 is formed to cover the first interlayer insulating layer 324 and the BC plugs 334. A second photoresist pattern 338 with an opening in a predetermined region is then formed on the second interlayer insulating layer 336. A DC hole 340 is formed to expose the first sub-active region 302*a* by anisotropically etching the second interlayer insulating layer 336 and the first interlayer insulating layer 324 using the second photoresist pattern 338 as an etch mask. Subsequently, a drain region 330*b* is formed by implanting N type impurity ions 328" into the first sub-active region 302*a* exposed by the DC hole 340.

Figure 18:
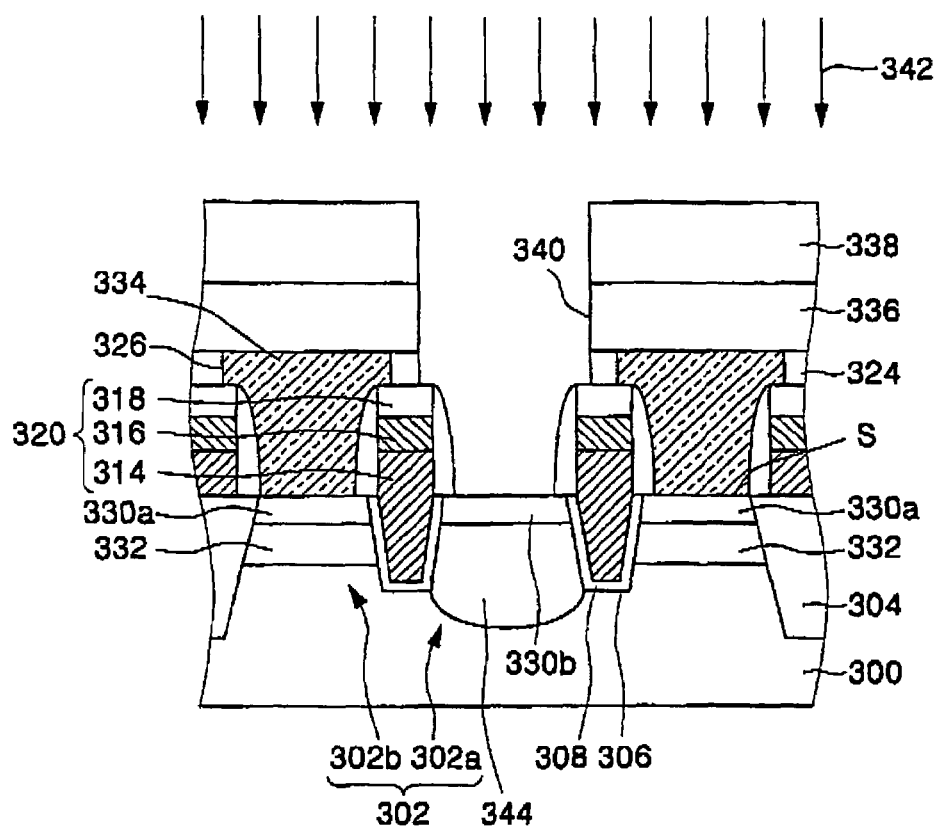

Referring to FIGS. 12 and 18, after the drain region 330*b* is formed, a channel impurity region 344 is formed beneath the drain region 330*b* by implanting P type impurity ions 342 into the first sub-active region 302*a* exposed by the DC hole 340. The channel impurity region 344 is preferably in contact with at least sidewalls of the channel trenches 306.

In alternative embodiments, the process of implanting the N type impurity ions 328", as illustrated in FIG. 17, and the process of implanting the P type impurity ions 342, as illustrated in FIG. 18, may be performed in a reverse order. Alternatively, the processes of implanting the impurity ions 328" and 342 may be performed using the second photoresist pattern 338 as an ion implantation mask, or may be performed using the second interlayer insulating layer 336 as an ion implantation mask after removing the second photoresist pattern 338.

Referring to FIGS. 12 and 19, the second photoresist pattern 338 is removed. A DC plug 346 that fills the DC hole 340 is then formed using the same process as described with respect to the embodiments illustrated in FIGS. 2-11. The DC plug 346 is electrically connected to the drain region 330*b*. Thereafter, although not illustrated, a process of forming a bit line that is electrically connected to the DC plug 346 and a process of forming a capacitor that is electrically connected to the BC plug 334 may be additionally performed.

Embodiments of the invention may be practiced in many ways. What follows are exemplary, non-limiting descriptions of some embodiments of the invention.

Embodiments of the invention include a transistor with an asymmetric channel region. The transistor includes a semiconductor substrate having an active region. A channel trench is disposed to cross the active region. A gate insulating layer covers an inner wall of the channel trench. A gate pattern is disposed to fill the channel trench and to extend over a main surface of the semiconductor substrate. Source/drain regions having a first conductivity are disposed in the active region at both sides of the channel trench. A channel impurity region having a second conductivity is disposed beneath one of the source/drain regions to be in contact with at least a sidewall of the channel trench.

In some embodiments, a low concentration impurity region may be disposed in the active region beneath the other one of the source and drain regions. The low concentration impurity region has the first conductivity and an impurity concentration that is lower than that of the source/drain regions.

Other embodiments of the invention include a semiconductor device having a transistor with an asymmetric channel region. The semiconductor device includes a semiconductor substrate having an active region. A channel trench is disposed to cross the active region. A gate insulating layer is disposed to cover an inner wall of the channel trench. A gate pattern is disposed to fill the channel trench and to extend over a main surface of the semiconductor substrate. Source and drain regions having a first conductivity are disposed in the active region at both sides of the channel trench, respectively. A channel impurity region is disposed beneath the drain region to be in contact with at least a sidewall of the channel trench, and the channel impurity region has a second conductivity.

Other embodiments include a method of fabricating a semiconductor device having a transistor with an asymmetric channel region.

In one embodiment, the method includes forming an isolation layer defining an active region in a semiconductor substrate. At least two channel trenches are formed to cross the active region. A preliminary gate pattern is formed to fill the channel trenches and to extend over a main surface of the semiconductor substrate. The preliminary gate pattern covers the active region between the channel trenches. Source regions are formed in the active region at both sides of the preliminary gate pattern by implanting impurity ions of a first conductivity into the semiconductor substrate having the preliminary gate pattern. A first interlayer insulating layer is formed on the semiconductor substrate to cover the preliminary gate pattern. BC plugs are formed to be in contact with the source regions through the first interlayer insulating layer. A second interlayer insulating layer is formed on the semiconductor substrate having the first interlayer insulating layer and the BC plugs. An inter-gate groove exposing the active region between the channel trenches and gate patterns separated by the inter-gate groove are formed by sequentially patterning the second interlayer insulating layer, the first interlayer insulating layer, and the preliminary gate pattern. A drain region is formed by implanting impurity ions of the first conductivity into the active region exposed by the inter-gate groove. A channel impurity region is formed beneath the drain region to be in contact with at least the sidewalls of the channel trenches by implanting impurity ions of a second conductivity into the active region exposed by the inter-gate groove.

In another embodiment, the method includes forming an isolation layer defining an active region in a semiconductor substrate. At least two channel trenches are disposed to cross the active region, wherein the channel trenches are formed to define a first sub-active region between the channel trenches and a second sub-active region spaced from the first sub-active region by the channel trenches. Gate patterns are formed to fill the channel trenches and to extend over a main surface of the semiconductor substrate. The gate patterns are spaced from each other. A first interlayer insulating layer is formed on the semiconductor substrate to cover the gate patterns. BC holes are formed to expose the second sub-active regions by patterning the first interlayer insulating layer. Source regions are formed in the second sub-active regions by implanting impurity ions of a first conductivity into the semiconductor substrate having the BC holes. BC plugs are formed to fill the BC holes. A second interlayer insulating layer is formed on the semiconductor substrate having the first interlayer insulating layer and the BC plugs. A DC hole is formed to expose the first sub-active region by sequentially patterning the second interlayer insulating layer and the first interlayer insulating layer. A drain region is formed in the first sub-active region by implanting impurity ions of the first conductivity into the semiconductor substrate having the DC hole. A channel impurity region is formed beneath the drain region to be in contact with at least the sidewalls of the channel trenches by implanting impurity ions of a second conductivity into the semiconductor substrate having the DC hole.

As described above, according to embodiments of the invention, the channel impurity region is asymmetrically formed beneath only one of a pair of source and drain regions constituting a transistor. As a result, the short channel effect and deterioration of the refresh characteristic due to the leakage current in the junction region may be simultaneously prevented.

Preferred embodiments of the invention have been disclosed and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the invention as set forth in the following claims.

The invention claimed is:

1. A method of fabricating a semiconductor device, comprising:
    defining an active region in a semiconductor substrate with an isolation layer;
    forming at least two channel trenches that cross the active region;
    covering the active region between the at least two channel trenches with a preliminary gate pattern, the preliminary gate pattern filling the at least two channel trenches and extending over a main surface of the semiconductor substrate;
    implanting impurity ions of a first conductivity type into the semiconductor substrate to form source regions in the active region at both sides of the preliminary gate pattern;
    covering the preliminary gate pattern by forming a first interlayer insulating layer on the semiconductor substrate;
    contacting the source regions through the first interlayer insulating layer with BC plugs;
    depositing a second interlayer insulating layer on the first interlayer insulating layer and the BC plugs;
    sequentially patterning the second interlayer insulating layer, the first interlayer insulating layer, and the preliminary gate pattern to form an inter-gate groove that exposes the active region between the at least two channel trenches and gate patterns separated by the inter-gate groove; and
    implanting impurity ions of the first conductivity into the active region exposed by the inter-gate groove to form a drain region; and
    implanting impurity ions of a second conductivity into the active region exposed by the inter-gate groove to form a channel impurity region beneath the drain region that is in contact with at least the sidewalls of the at least two channel trenches.

2. The method according to claim 1, further comprising, before covering the active region with a preliminary gate pattern, covering the inner walls of the channel trenches and a surface of the active region with a gate insulating layer.

3. The method according to claim 1, further comprising, before implanting impurity ions to form source regions, implanting impurity ions of the first conductivity into the semiconductor substrate to form a low concentration impurity layer in the active region.

4. The method according to claim 3, wherein implanting impurity ions to form the low concentration impurity layer comprises implanting the impurity ions such that a depth of the low concentration impurity layer from the surface of the semiconductor substrate is greater than a depth of the source regions from the surface of the semiconductor substrate.

5. The method according to claim 1, further comprising, after forming the source regions, implanting impurity ions having the first conductivity into the semiconductor substrate to form a low concentration impurity layer beneath the source regions.

6. The method according to claim 1, further comprising, before forming the first interlayer insulating layer, covering a sidewall of the preliminary gate pattern with a gate spacer.

7. The method according to claim 1, further comprising, after forming the channel impurity region:
    covering a sidewall of the inter-gate groove with a groove spacer;
    filling the inter-gate groove with a filling dielectric layer; and
    contacting the drain region through the filling dielectric layer with a DC plug.

* * * * *